(12) United States Patent
Young et al.

(10) Patent No.: US 6,278,089 B1
(45) Date of Patent: Aug. 21, 2001

(54) HEATER FOR USE IN SUBSTRATE PROCESSING

(75) Inventors: Douglas W. Young, Sunnyvale; Hooman Bolandi, Santa Clara; Charles D. Schaper, Union City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/432,287

(22) Filed: Nov. 2, 1999

(51) Int. Cl.$^7$ .......................................... H05B 3/68

(52) U.S. Cl. ...................................... 219/443.1; 219/408.2

(58) Field of Search .............................. 219/443.1, 444.1, 219/460.1, 461.1, 462.1, 465.1, 466.1, 467.1, 468.1, 468.2, 544; 338/252, 253, 285; 118/724, 725

(56) References Cited

U.S. PATENT DOCUMENTS

| | | | | |
|---|---|---|---|---|
| 535,321 | * | 3/1895 | Delany | 338/253 |
| 2,387,460 | * | 10/1945 | Myers | 219/468.1 |
| 3,110,795 | * | 11/1963 | Bremer | 219/468.1 |
| 3,904,850 | * | 9/1975 | Johnson | 219/528 |
| 4,481,407 | * | 11/1984 | Stokes et al. | 219/468.1 |
| 5,225,662 | * | 7/1993 | Schmidt | 219/544 |
| 5,835,334 | * | 11/1998 | McMillin et al. | 361/234 |
| 5,927,077 | * | 7/1999 | Hisai et al. | 219/444.1 |

FOREIGN PATENT DOCUMENTS

04150022 * 5/1992 (EP) ..................................... 118/724

* cited by examiner

Primary Examiner—Sang Paik
(74) Attorney, Agent, or Firm—Dugan and Dugan

(57) ABSTRACT

A heater is provided for use in substrate processing. In a first aspect, the heater is formed from a heater plate including an upper surface having at least one recess formed therein, a heater element wire disposed within the at least one recess and an electrically insulating and thermally conductive material disposed within the at least one recess so as to electrically insulate the heater element wire from the heater plate. Preferably a plurality of recesses are formed within the upper surface, a heater element wire is disposed within each recess and an electrically insulating and thermally conductive material is disposed within each recess so as to electrically insulate the heater element wire within each recess from the heater plate. A plurality of heating zones thereby may be formed. The electrically insulating and thermally conductive material preferably comprises a material deposited within the recess so as to embed the heater element wire within the electrically insulating and thermally conductive material. The electrically insulating and thermally conductive material also may comprise a plurality of insulating beads that surround the heater element wire. In a second aspect of the invention, the heater comprises a heater plate including an upper and a lower surface, the lower surface of the heater plate having a plurality of cooling fins or other surface features formed therein so as to increase the surface area of the lower surface. A method for cooling a heater also is provided wherein a lower surface of the heater's heater plate is sprayed with a cooling liquid so as to cool the heater. The temperature of the cooling liquid preferably is decreased gradually from a first temperature to a second temperature so as to cool the heater gradually.

28 Claims, 3 Drawing Sheets

HEATER FOR USE IN SUBSTRATE PROCESSING

FIELD OF THE INVENTION

The present invention relates generally to methods and apparatuses for providing uniform heating during the thermal cycling of material substrates. More particularly, the present invention relates to a heater capable of providing high temperature thermal cycling without failure.

BACKGROUND OF THE INVENTION

Certain stages of semiconductor manufacturing require thermal cycling of a semiconductor substrate, wherein the substrate is repeatedly heated and then cooled. For example, each photoresist processing stage of semiconductor manufacturing requires a heating, or baking, step to flow the photoresist material along the substrate surface, followed by a cooling step to set the photoresist. In order to produce high quality substrates suitable for state of the art integrated circuit applications, the temperature of a substrate during thermal cycling must be precisely controlled with respect to both temporal temperature profile and temperature uniformity across the substrate.

Conventional heaters typically employ resistive heating elements that are bonded/brazed to heat conduction plates, and/or employ integrated bake and chill plates having a plurality of cooling fluid channels and microchannels to affect cooling as described in commonly assigned U.S. patent application Ser. No. 08/939,926 filed Sep. 29, 1997. As a result of stresses introduced by repeatedly heating and cooling a heat conduction plate, delamination of bonded/brazed resistive heating elements can occur, requiring process downtime during heater replacement and generating safety concerns due to broken wires and/or open circuits. Further, the use of microchannels to affect cooling increases heater manufacturing costs and thus the cost per wafer processed.

Accordingly, it is an object of the present invention to provide an improved heater apparatus which can withstand repeated thermal cycling and that is easily manufacturable.

SUMMARY OF THE INVENTION

To address the shortcomings of the prior art, an inventive heater is provided for use in substrate processing.

In a first aspect of the invention, the heater is formed from a heater plate including an upper surface having at least one recess formed therein, a heater element wire disposed within the at least one recess and an electrically insulating and thermally conductive material disposed within the at least one recess so as to electrically insulate the heater element wire from the heater plate. The heater plate preferably comprises a ceramic such as aluminum nitride or a metal such as aluminum and/or copper.

Preferably a plurality of recesses are formed within the upper surface of the heater plate, and a heater element wire is disposed within each recess. An electrically insulating and thermally conductive material is disposed within each recess so as to electrically insulate the heater element wire disposed therein from the heater plate. For example, the plurality of recesses may comprise an inner recess that forms an inner heating zone for the heating plate and an outer recess that forms an outer heating zone for the heating plate. Alternatively, the plurality of recesses may comprise a plurality of stacked recesses such as at least one x-axis recess having a first depth within the heater plate and at least one y-axis recess having a second depth within the heater plate, so as to form a plurality of heating zones.

The electrically insulating and thermally conductive material preferably comprises a material (e.g., TEFLON™) deposited within the recess so as to embed the heater element wire within the electrically insulating and thermally conductive material, and further may form an electrically insulating and thermally conductive layer over the entire upper surface of the heater plate if desired. The electrically insulating and thermally conductive material also may comprise a plurality of insulating beads that surround the heater element wire. Most preferably the heater element wire is threaded through each insulating bead in the manner beads are threaded on a necklace. When insulating beads are employed, an electrically insulating and thermally conductive layer may be deposited prior to, and/or after the plurality of insulating beads are inserted within the recess to further reduce the probability of shorts.

In a second aspect of the invention, the heater comprises a heater plate including an upper and a lower surface, wherein the lower surface of the heater plate has a plurality of cooling fins or other surface features formed therein so as to increase surface area. The increased surface area increases the heater's cooling rate, therefore increasing throughput by decreasing the heaters cycle time from hot to cold.

In a third aspect, the invention comprises a method for cooling a heater by spraying the lower surface of the heater plate with a cooling liquid (e.g., water) so as to cool the heater. The temperature of the cooling liquid preferably is decreased from a first temperature (e.g., 100° C.) to a second temperature (e.g., 20° C.) so as to cool the heater gradually.

By providing the upper surface of the heater with a plurality of recesses, each having a heater element wire disposed therein, multiple heater zones may be defined within the heater to improve heater temperature uniformity. Cooling fins or other surface features increase the heater's cooling efficiency and varying the temperature of cooling fluid employed to cool the heater reduces the thermal stress experienced by the heater during thermal cycling, thereby extending heater life. Further, a heater having upper surface recesses and/or cooling fins is easier to manufacture than conventional heaters making the inventive heater more reliable, and less expensive than conventional heaters.

Other objects, features and advantages of the present invention will become more fully apparent from the following detailed description of the preferred embodiments, the appended claims, and the accompanying drawings.

DETAILED DESCRIPTION OF THE PREFERRED EMBODIMENT

Figure 1A:
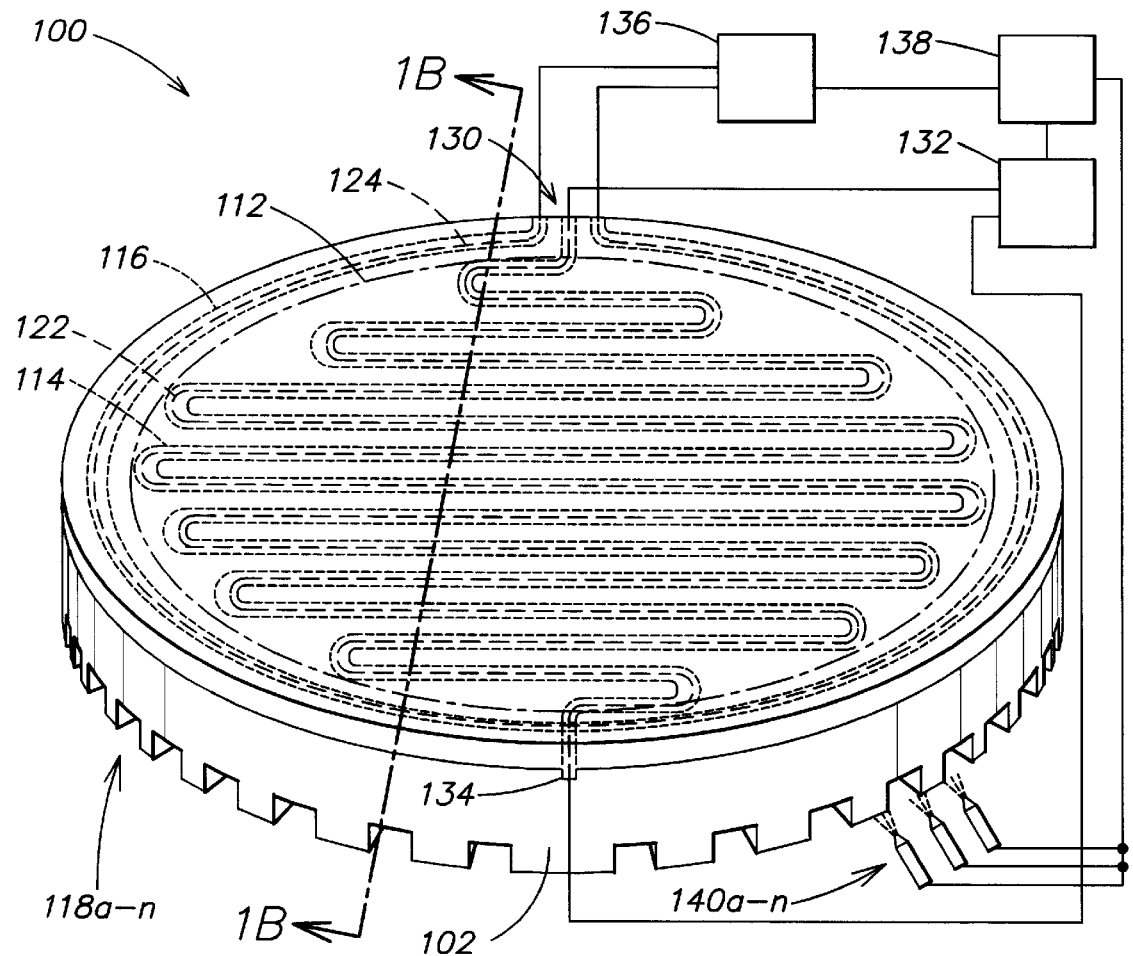
FIG. 1A is a perspective view of an inventive heater configured in accordance with a first aspect of the present invention.
Figure 1B:
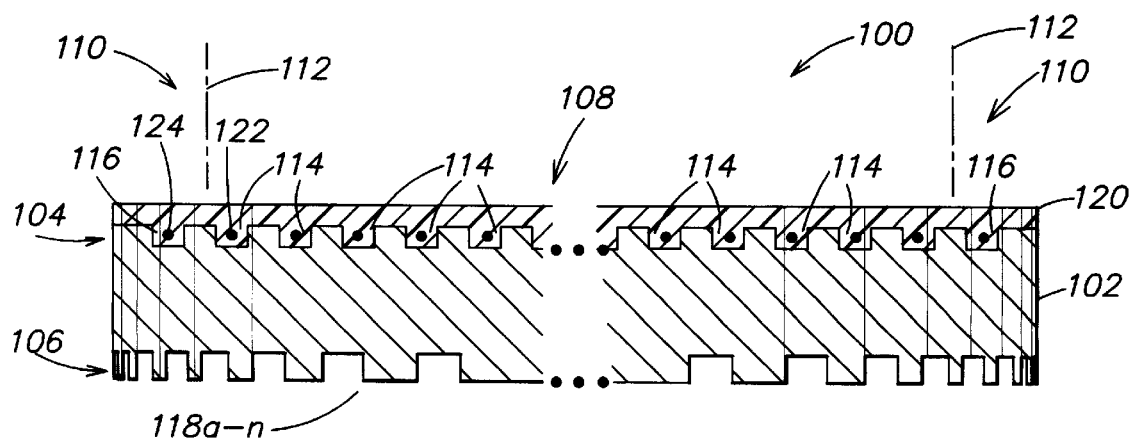
FIG. 1B is a side cross-sectional view of the heater of FIG. 1A taken along line 1B—1B.

FIG. 1A is a perspective view of an inventive heater 100 configured in accordance with a first aspect of the present invention. FIG. 1B is a side cross-sectional view of the heater 100 taken along line 1B—1B of FIG. 1A. The heater 100 comprises a heater plate 102 formed from a ceramic such as aluminum nitride or a metal such as aluminum and/or copper by conventional methods, and having a frontside 104 and a backside 106. The frontside 104 of the heater plate 102 is divided into an inner heating zone 108 and an outer heating zone 110 as indicated by phantom lines 112. An inner recess 114 (e.g., a serpentine recess) is formed (e.g., machined) within the inner heating zone 108 of the frontside 104 and an outer recess 116 is formed (e.g., machined) within the outer heating zone 110 of the frontside 104. The particular shapes of the recesses 114, 116 in FIG. 1A are merely exemplary and any recess shape may be employed to affect heating. Additional or fewer heating zones may be employed, as desired.

In accordance with a first aspect of the invention, an electrically insulating and thermally conductive (EITC) material 120 is deposited within the inner recess 114 and the outer recess 116 so as to fill approximately 25% of the recess with the EITC material 120. The EITC material 120 may comprise any high temperature insulating coating but preferably comprises Teflon™, FEP, PTFE, etc. Both FEP and PTFE are manufactured by Dupont. Thereafter, a first heater element wire 122 is placed within the inner recess 114 and a second heater element wire 124 is placed in the outer recess 116. The heater element wires 122, 124 may comprise any conventional heater element wire such as a copper wire.

Following placement of the wires 122, 124, additional EITC material is deposited over the frontside 104 of the heater plate 102 so as to fill the inner recess 114 and the outer recess 116. Thereafter the EITC material 120 is planarized (e.g., via chemical mechanical polishing as is known in the art). The EITC material 120 may be planarized so that the EITC material within the inner recess 114 and the outer recess 116 is co-planar with the frontside 104, or alternatively so that a layer of the EITC material 120 exists over the entire frontside 104 as shown in FIG. 1B. As a frontside layer, an EITC material thickness of about ⅛ of an inch is preferred.

Figure 1C:
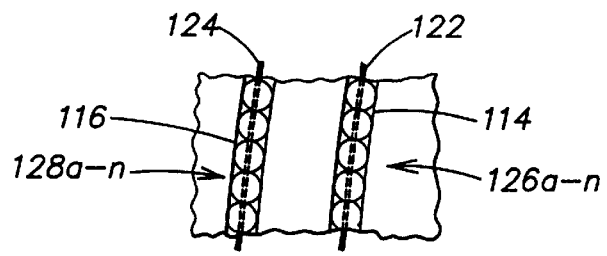
FIG. 1C is a partial top view of the heater element wires of FIG. 1A which shows a plurality of insulating beads mounted thereon.
Figure 1D:
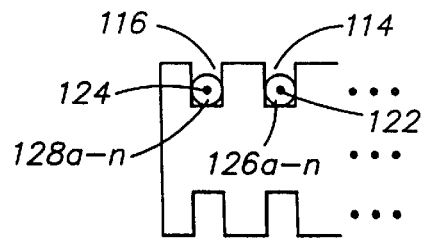
FIG. 1D is a side cross-sectional view of the heater of FIG. 1C.
Figure 1E:
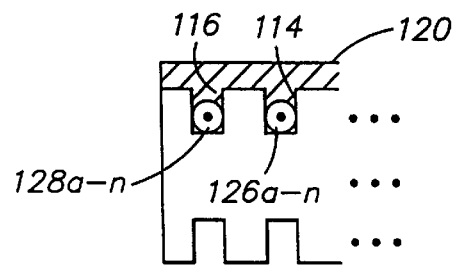
FIG. 1E is a side cross-sectional view of the heater of FIG. 1C wherein an electrically insulating and thermally conductive thermally conductive material is disposed over the insulating beads.
Figure 1F:
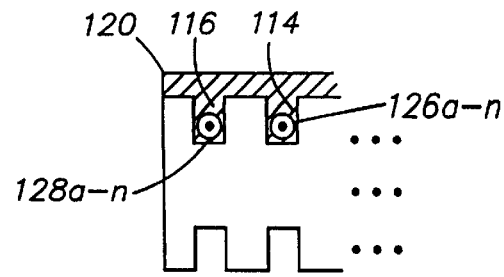
FIG. 1F is a side cross-sectional view of the heater of FIG. 1C wherein an electrically insulating and thermally conductive thermally conductive material surrounds the insulating beads.

As an alternative embodiment, the first heater element wire 122 and the second heater element wire 124 may be encased within a plurality of electrically insulating and thermally conductive thermally conductive beads 126a–n, 128a–n, (e.g., spherical ceramic beads) prior to placement within the inner recess 114 and the outer recess 116, respectively, as shown in the partial top view of the first heater element wire 122 and the second heater element wire 124 of FIG. 1C. In this manner, the first heater element wire 122 and the second heater element wire 124 are prevented from short-circuiting via contact with the heater plate 102 whether or not the EITC material 120 is employed. For example, if the beads 126a–n and 128a–n are sized to snuggly fit within the inner recess 114 and the outer recess 116, respectively, the EITC material 120 need not be employed as shown in FIG. 1D. The EITC material 120 nonetheless may be employed to hold the beads 126a–n, 128a–n within the inner recess 114 and the outer recess 116, respectively (FIG. 1E), or to provide additional electrical insulation around the beads 126a–n, 128a–n and thus to avoid shorting should any of the beads crack or break (FIG. 1F).

The beads 126a–n, 128a–n preferably comprise a ceramic (e.g., glass) but may comprise any electrically insulating, (but preferably thermally conductive) material. While shown as spherical in FIGS. 1C–1F, any suitable shape may be employed for the beads 126a–n, 128a–n. Preferably the inner recess 114, the outer recess 116, and the beads 26a–n, 128a–n are uniform in dimension for ease of manufacture.

With reference to FIG. 1A, a first end of the first heater element wire 122 extends from a first portion 130 of the heater 100, and a second end of the first heater element wire 122 extends from a second portion 134 of the heater 100. Both ends of the first heater element wire 122 couple to a first power source 132. Both ends of the second heater element wire 124 extend from the first portion 130 of the heater 100 and couple to a second power source 136. Alternatively, both ends of each heater element wire may extend from different portions of the heater 100 to allow for better heat control of the portions of the heater 100 through which heater element wires extend as described below with reference to FIG. 2. A controller 138 is coupled to both the first power source 132 and the second power source 136.

In operation, the controller 138 directs the first power source 132 and the second power source 136 to supply current to the first heater element wire 122 and the second heater element wire 124, respectively. In response thereto, resistive heat is generated by each heater element wire 122, 124 so as to heat the heater 100. As observed in conventional heater assemblies, the center of a heater plate often reaches a higher temperature than the peripheral regions of the heater despite a similar power density being delivered to each region (e.g., due to air cooling which occurs along the edges of the heater plate because the edges, unlike the center portion of the heater plate, are surrounded by a cooler medium). Accordingly, the controller 138 preferably directs the second power source 136 to deliver more power to the second heater element wire 124 than is delivered to the first heater element wire 122 so as to compensate for peripheral heat loss. A more uniform heater temperature (e.g., typically centered about 150° C.) thereby is maintained. Note that the ability to "snake" a wire (and a bead) through a heater plate allows for improved watt density uniformity for the heater 100 compared to conventional heater designs as the outer heater element can provide greater heat per unit area than does the central heater element, allows for multiple and simplified zone control and allows wire terminations to extend from various portions of the heater 100 as described further below.

Following heating of the heater 100, cooling is performed by turning off the first power source 132 and the second power source 136 and by cooling the backside 106 of the heater plate 102. For example, the controller 138 may direct a plurality of nozzles 140a–n to spray the backside 106 with a cooling fluid (e.g., water) whether or not cooling fins are employed. Preferably the cooling fluid is elevated in temperature before impinging the backside 106 (e.g., to about 100° C.) and then is decreased in temperature during cooling of the heater 100 (e.g., to about 20° C.). Alternatively, the backside 106 may be submerged in cooling fluid, or cooling channels may be formed in the backside 106 as is known in the art. The cooling fins 118a–n are merely preferred and any other backside surface configuration may be employed to affect cooling.

Figure 2A:
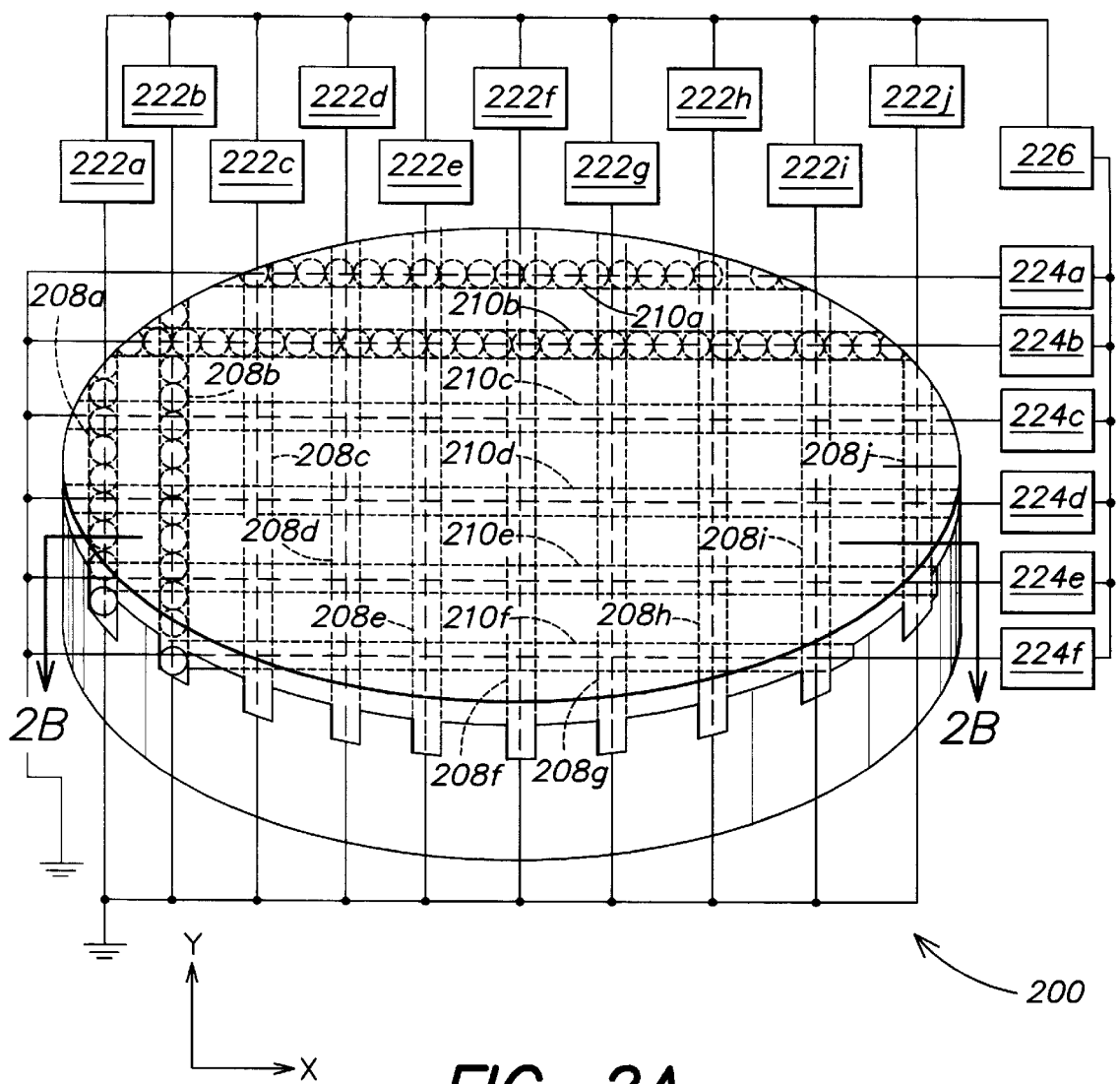
FIG. 2A is a perspective view of an inventive heater configured in accordance with a second aspect of the present invention.
Figure 2B:
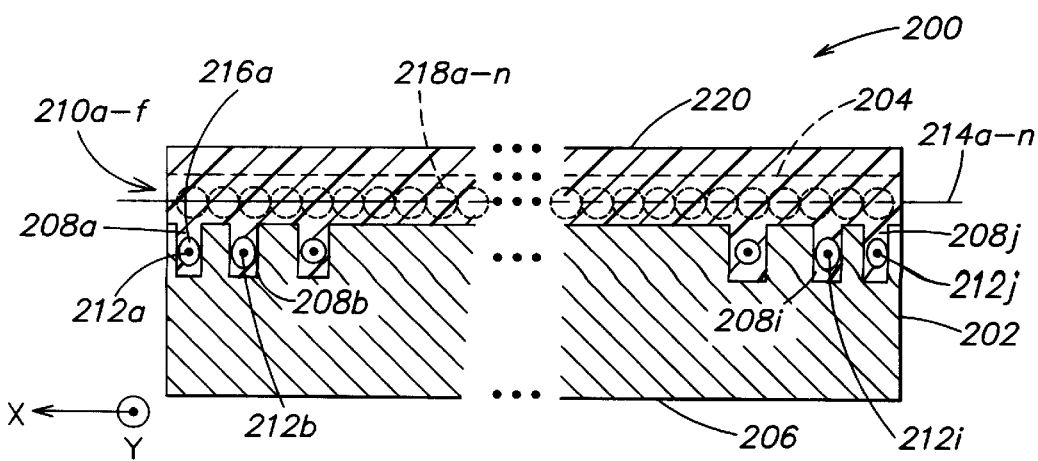
FIG. 2B is a side cross-sectional view of the heater of FIG. 2A taken along line 2B—2B.

FIG. 2A is a perspective view of an inventive heater 200 configured in accordance with a second aspect of the present invention. FIG. 2B is a side cross-sectional view of the heater 200 taken along line 2B—2B of FIG. 2A. As with the heater 100 of FIG. 1A, the heater 200 of FIG. 2A comprises a heater plate 202 formed from a ceramic or a metal by conventional means and having a frontside 204 (e.g., the top surface) and a backside 206 (e.g., the bottom surface). Instead of employing separate heating zones such as the inner and outer heating zones 108,110, of the heater 100, the heater 200 is provided with a plurality of x-axis recesses 208a–j and a plurality of y-axis recesses 210a–f respectively having a plurality of x-axis heating element wires 212a–j and a plurality of y-axis heating element wires 214a–f placed therein. Preferably the heating element wires 212a–j and 214a–f are encased within a plurality of x-axis and y-axis insulating beads 216a–n, 218a–n, respectively (as shown in FIGS. 2A–2B), and are surrounded by an EITC material layer 220 (as previously described with reference to FIG. 1F) that is planarized above the surface of the frontside 204 of the heater 200. Note that the insulating beads 216a–n, 218a–n and the front surface EITC material layer 220 are optional. If desired, the EITC material layer 220 may be planarized to be approximately co-planar with the frontside 204 as previously described with reference to FIGS. 1A and 1B. Preferably, the EITC material layer 220 extends about 25% of the thickness of the y-axis recesses 210a–f above the frontside 204. The preferred depth for the x-axis recesses 208a–j is ³⁄₁₆ to ¼ of an inch while the preferred depth for the y-axis recesses 210a–f is ³⁄₁₀₀,₀₀₀ to ⅔ of an inch. The x-axis and y-axis recesses 208a–j, 210a–f need not be straight nor parallel with respect to each other at one level and orthogonal between levels. Fewer or more recesses may be employed if desired.

Each heating element wire may be controlled simultaneously, as part of a group of heating element wires or individually. Preferably a separate x-axis power source 222a–j and a separate y-axis power source 224a–f, (each controlled by a controller 226) is employed for each heating element wire 212a–j, 214a–f, respectively, so that each heating element wire may be individually elevated in temperature. In this manner, the inner, outer or any other heating zone of the heater 200 may be easily controlled by adjusting the current flow through the heating element wires within the desired zone. The backside 206 may be provided with cooling fins, cooling channels or the like (not shown) for cooling the heater 200 as previously described with reference to FIGS. 1A–1B.

Because of the "stacked" nature of the x and y-axis recesses 208a–j, 210a–f, no heater element wire "traffic area" problems are produced with the heater 200, and individual control of each heater element wire allows for multi-zone applications such as peripheral heat loss compensation wherein an outer heater element provides greater heat per unit area than does the central heater element. As with the snaked recess configuration of FIGS. 1A–1B, the stacked recess configuration of FIGS. 2A–2B allows for improved watt density uniformity and for ease of manufacture, as compared to conventional heater designs. Because each heating element wire extends from a separate portion of the heater 200, the temperature of each portion of the heater 200 may be individually controlled (e.g., unlike the first portion 130 of the heater 100 in FIG. 1A).

The foregoing description discloses only the preferred embodiments of the invention, modifications of the above disclosed apparatus and method which fall within the scope of the invention will be readily apparent to those of ordinary skill in the art. For instance, while the inner and outer recess 114, 116 and the x-axis and y-axis recesses 208a–j, 210a–f preferably are uniform in shape, and the insulating beads preferably are round and fit snuggly therein, any recess size or shape and any insulating bead size or shape may be similarly employed. The specific layout of recesses, the shape of the heater plate, the shape of any cooling fins and the positioning of fluid nozzles may vary from that shown. Further, one or both of the heating element wires 212, 214, with or without the insulating beads, can be disposed entirely within the front surface EITC material. Although not shown in the figures, it is understood that the inventive heater employs a conventional substrate lift/lower mechanism, such as a lift hoop or a plurality of lift pins. The heater may also employ a thermally conductive plate coupled to the top surface thereof, as described in commonly assigned U.S. patent application Ser. Nos. 08/939,926, filed Sep. 29, 1997, and (AMAT No. 2989/PRP/DV), filed herewith, the entire disclosures of which are incorporated herein by this reference.

Accordingly, while the present invention has been disclosed in connection with the preferred embodiments thereof, it should be understood that other embodiments may fall within the spirit and scope of the invention, as defined by the following claims.

The invention claimed is:

1. A heater comprising:
    a heater plate including an upper surface having a first recess and a second recess formed therein;
    a first heater element wire disposed within the first recess;
    a second heater element wire disposed within the second recess;
    an electrically insulating and thermally conductive material disposed within the first and second recesses so as to electrically insulate the first and second heater element wires from the heater plate while maintaining thermal contact between the first and second heater element wires and the heater plate;
    a first power source coupled to the first heater element wire and adapted to deliver current thereto; and
    a second power source coupled to the second heater element wire and adapted to deliver current thereto.

2. The heater of claim 1 wherein the heater plate comprises a material selected from the group consisting of a ceramic and a metal.

3. The heater of claim 1 wherein each heater element wire enters and exits the heater plate from a different portion of the heater plate.

4. The heater of claim 1 wherein:
    the first recess forms an inner heating zone for the heating plate; and
    the second recess forms an outer heating zone for the heating plate.

5. The heater of claim 4, wherein the first recess is serpentine.

6. The heater of claim 5, wherein the first heater element wire enters the heater plate from one portion of the heater plate and exits the heater plate from a different portion of the heater plate.

7. The heater of claim 1 wherein the electrically insulating and thermally conductive material comprises an electrically insulating and thermally conductive material deposited within the recess so as to embed the heater element wire within the electrically insulating and thermally conductive material.

8. The heater of claim 7 wherein the electrically insulating and thermally conductive material comprises TEFLON™.

9. The heater of claim 7 wherein the electrically insulating and thermally conductive material forms an electrically insulating and thermally conductive layer over the upper surface of the heater plate.

10. The heater of claim 1 wherein the electrically insulating and thermally conductive material comprises a plurality of insulating beads that surround the first and second heater element wires and that fit within the first and second recesses and extend to the top of the first and second recesses such that additional material is not deposited over the plurality of insulating beads.

11. The heater of claim 1 wherein the electrically insulating and thermally conductive material comprises a plurality of insulating beads and further comprises an electrically insulating and thermally conductive layer deposited over the plurality of insulating beads.

12. The heater of claim 1 wherein the electrically insulating and thermally conductive material comprises a plurality of insulating beads and further comprises an outer electrically insulating and thermally conductive material that surrounds the plurality of insulating beads.

13. The heater of claim 1 wherein a backside of the heater plate comprises a plurality of cooling fins.

14. A heater comprising:
a heater plate including an upper surface having a plurality of recesses formed therein;
a heater element wire disposed within each recess;
an electrically insulating and thermally conductive material disposed within each recess so as to electrically insulate the heater element wire within each recess from the heater plate while maintaining thermal contact between the heater element wire and the heater plate;
wherein the plurality of recesses comprise a plurality of stacked recesses so as to form a plurality of heating zones for the heating plate.

15. The heater of claim 14 wherein the plurality of stacked recesses comprise:
at least one x-axis recess having a first depth; and
at least one y-axis recess having a second depth.

16. A heater system comprising:
the heater of claim 1; and
a controller coupled to the first and second power sources and adapted to adjust the respective currents delivered to the first and second heater element wires from the first and second power sources so as to heat the heater plate to a predetermined temperature.

17. A method of forming a heater comprising:
providing a heater plate having an upper and a lower surface;
forming a first recess and a second recess within the upper surface of the heater plate;
placing a first heater element wire within the first recess and a second heater element wire within the second recess;
electrically insulating the first and second heater element wires from the heater plate via an electrically insulating and thermally conductive material disposed within the first and second recesses;
coupling the first heater element wire to a first power source; and
coupling the second heater element wire to a second power source.

18. The method of claim 17, wherein the first recess is formed so as to form an inner heating zone for the heating plate, and the second recess is formed so as to form an outer heating zone for the heating plate.

19. The method of claim 17, wherein electrically insulating the first and second heater element wires from the heater plate via an electrically insulating and thermally conductive material comprises depositing an electrically insulating and thermally conductive material within the first and second recesses so as to embed the first and second heater element wires within the electrically insulating and thermally conductive material.

20. The method of claim 17, wherein electrically insulating the first and second heater element wires from the heater plate via an electrically insulating and thermally conductive material comprises surrounding the first and second heater element wires with a plurality of insulating beads.

21. The method of claim 17 further comprising depositing an electrically insulating and thermally conductive layer over the upper surface of the heater plate.

22. The method of claim 17 further comprising forming a plurality of cooling fins within the lower surface of the heater plate.

23. The method of claim 17 further comprising:
spraying a lower surface of the heater plate with a cooling liquid so as to cool the heater.

24. The method of claim 23 wherein the cooling liquid comprises water.

25. The method of claim 23 further comprising providing the lower surface of the heater plate with a plurality of cooling fins.

26. The method of claim 23 wherein spraying the lower surface of the heater plate with a cooling liquid comprises spraying the lower surface of the heater plate with a cooling liquid having a temperature that varies from a first temperature to a second temperature so as to cool the heater.

27. The method of claim 26 wherein the first temperature comprises about 100° C. and wherein the second temperature comprises about 20° C.

28. A method of forming a heater comprising:
providing a heater plate having an upper and a lower surface;
forming a plurality of stacked recesses within the upper surface so as to form a plurality of heating zones for the heater plate;
placing a heater element wire within each of the plurality of stacked recesses;
electrically insulating the heater element wire from the heater plate via an electrically insulating and thermally conductive material disposed within each stacked recess.

* * * * *